United States Patent
Kaiya et al.

(10) Patent No.: US 6,460,773 B1
(45) Date of Patent: Oct. 8, 2002

(54) COMBINATION CARD HAVING AN IC CHIP MODULE

(75) Inventors: Hiroshi Kaiya; Toshiyuki Honda, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 15 days.

(21) Appl. No.: 09/660,946

(22) Filed: Sep. 13, 2000

(30) Foreign Application Priority Data

Oct. 12, 2000 (JP) .............................. 11-289936

(51) Int. Cl.[7] .......................... G06K 19/06; G06K 7/06
(52) U.S. Cl. ........................................ 235/492; 235/441
(58) Field of Search ................................ 235/375 FOR, 235/491, 492, 493, 488, 486, 487, 441; 257/678, 698

(56) References Cited

U.S. PATENT DOCUMENTS

| | | | | |
|---|---|---|---|---|
| 5,612,532 A | * | 3/1997 | Iwasaki | 235/492 |
| 6,049,463 A | * | 4/2000 | O'Malley et al. | 361/760 |
| 6,288,443 B1 | * | 9/2001 | Finn et al. | 257/678 |

FOREIGN PATENT DOCUMENTS

| | | |
|---|---|---|
| DE | 197 33 124 | 12/1998 |
| EP | 1093082 A2 * | 4/2001 |
| FR | 2753819 | 3/1998 |
| FR | 2788646 | 7/2000 |
| JP | 409123654 A * | 5/1997 |
| JP | 4112194 * | 10/1999 |
| JP | 2000182017 A * | 6/2000 |
| JP | 2000353227 A * | 12/2000 |
| WO | WO 97/34247 | 9/1997 |

OTHER PUBLICATIONS

European Search Report for Application No. 00307934 dated Apr. 26, 2002.

* cited by examiner

*Primary Examiner*—Thien M. Le
(74) *Attorney, Agent, or Firm*—Armstrong, Westerman & Hattori, LLP

(57) ABSTRACT

A module of a combination card can be incorporated into a card body with solder being easily melted, and heat transmission to portions other than the antenna connection terminals is reduced. A card body is provided with an antenna. The module includes a substrate which has a terminal surface on which at least one external connection terminal is formed and a mounting surface opposite to the terminal surface. An IC chip is mounted on the mounting surface. The module includes at least one antenna connection terminal located on the mounting surface. The antenna connection terminal is connected to the antenna, and at least a part of the antenna connection terminal is exposed on the terminal surface.

16 Claims, 11 Drawing Sheets

HEATING JIG

HEATING JIG

COMBINATION CARD HAVING AN IC CHIP MODULE

BACKGROUND OF THE INVENTION

1. Field of the Invention

The present invention generally relates to an IC card and, more particularly, to a combination card which can exchange data with an external device by both a contacting method and a non-contacting method.

Presently, in order to connect an IC card to an external device, there are two methods, one is a contacting method and the other is a non-contacting method. In the contacting method, an IC card having terminals exposed on a surface thereof is used. When such an IC card is attached to the external device, the terminals of the external device are made in contact with the terminals of the IC card and are electrically connected thereto so that data exchange can be performed between the IC card and the external device.

On the other hand, in the non-contacting method, an IC card provided with an antenna inside thereof is used. When such an IC card is attached to an IC card reader or positioned close to the IC card reader, data exchange is performed by radio communication between the IC card and the IC card reader. Relatively simple data is exchanged by the non-contacting method. For example, data used for an attestation of an ID number in a security system may be exchanged by the non-contacting method.

There is a combination card, which is an IC card that can be used by both the contacting method and the non-contacting method. That is, the combination card, is an IC card provided with both the connection terminals for exchanging data by the contacting method and an antenna for exchanging data by the non-contacting method.

2. Description of the Related Art

A description will now be given, with reference to FIGS. 1 to 6, of a conventional combination card. FIG. 1 is a plan view of a conventional combination card.

As shown in FIG. 1, the conventional combination card comprises a card body 1 and an IC card module 2 (hereinafter simply referred to as a module) incorporated in the card body 1. The card body 1 is made of a plastic material. A loop antenna 3 is incorporated in the card body 1.

A plurality of external connection terminals (electrodes) 4 are formed on one side of the module. The module 2 is incorporated in the card body 1 so that the external connection terminals 4 are exposed on the surface of the card body 1. Hereinafter, the surface on which the external connection terminals 4 are exposed is referred to as a terminal surface. When the combination card is used by the connecting method, the data exchange is performed by the external connection terminals 4 contacting the terminals of the external devices.

Antenna terminals 5 are provided on a side of the module 2 opposite to the terminal surface. Opposite ends of the antenna 3 are connected to the antenna connection terminals 5. Hereinafter, the surface opposite to the terminal surface of the module 2 is referred to as a mounting surface.

A description will now be given, with reference to FIGS. 2 to 4, of a structure of the module 2. FIG. 2 is a plan view of the terminal surface of the module 2. FIG. 3 is a plan view of the mounting surface of the module 2.

The module 2 comprises a circuit substrate 7 and an IC chip 8 (refer to FIG. 4) mounted on the circuit substrate 7. As shown in FIG. 2, a plurality of external connection terminals (electrodes) 4 are formed on the terminal surface of the module 2. The external connection terminals 4 are formed by patterning a copper plate applied to the circuit substrate 7 by etching. It should be noted that the area indicated by double dashed chain lines in the center of each of the external connection terminals 4 in FIG. 2 corresponds to an effective are of each of the external connection terminals 4.

As shown in FIG. 3, the IC chip 8 is mounted on the mounting surface of the module 2, and is encapsulated by seal resin. Antenna connection terminals 5 are formed on the mounting surface outside the seal resin 9.

FIG. 4 is a plan view of the module 2 before the IC chip 8 is encapsulated by the seal resin 9. The IC chip 8 is mounted on the center of the circuit substrate 7. The electrodes of the IC chip 8 are connected to respective lead wires 10 formed on the mounting surface of the circuit substrate 7 by bonding wires 11, respectively. The lead wires 10 are electrically connected to the respective external connection terminals 4 on the terminal surface of the circuit substrate 7 via respective through holes 12.

A description will now be given, with reference to FIG. 5, of a process of incorporating the module 2 into the card body 1. The card body 1 is previously provided with antenna 3. A recess 1a is formed in a predetermined portion of the card body 1. Opposite ends of the antenna 3 are exposed in the vicinity of the recess 1a so that the antenna connection terminals of the module 2 are connected thereto.

First, paste-like solder 13 is applied onto the antenna connection terminals 5 of the module 2. Then, the module 2 is assembled to the card body 1 so that the seal resin 9 fits in the recess 1a of the card body 1. At this time, the solder 13 on the antenna connection terminals 5 contacts the opposite ends.of the antenna 3. In this state, a heating jig (solder iron) is pressed from the terminal surface side of the module 2 so as to melt the solder 13 by heat from the heating jig o connect the antenna connection terminals 5 and the ends of the antenna 3 to each other. The heating jig is configured and arranged to locally heat a portion corresponding to the antenna connection terminals 5 so that the heat provided by the heating jig is not transmitted to the IC chip 8 as much as possible. Additionally, since the card body 1 is formed of a plastic material having a relatively low heat resistance, the heating temperature must be controlled so that the temperature of the solder 13 does not exceed the melting point of the solder too much.

FIG. 6 is a side view of the module 2 for explaining the process of incorporating the module 2 into a sheet provided with antenna. In the case of FIG. 6, the antenna 3 is applied to the sheet 14. The sheet 14 is provided with an opening 14a in which the seal resin 9 of the module 2 is fitted. The heating jig shown in FIG. 6 is also configured and arranged to locally heat a portion corresponding to the antenna connection terminals 5. Additionally, since the sheet 14 is formed of a material having a relatively low heat resistance, the heating temperature must be controlled so that the temperature of the solder 13 does not exceed the melting point of the solder too much.

However, in order to melt the solder 13 applied to the antenna connection terminals 5 provided on the mounting surface by heating from the terminal surface, side, there may be following problems.

1) In order to melt the solder 13 by making the heating jig in contact with the external connection terminals 4, the heat must be transmitted through the circuit substrate 7. However, the circuit substrate 7 is formed of a material, which has a relatively low thermal conductivity. Accordingly, in order to melt the solder 13, the temperature of the heating jig must be raised or the heating time must be increased.

2) The external connection terminals 4 are formed of copper, which has a high thermal conductivity. Accordingly, the heat of the heating jig can easily transmit to a portion adjacent to the IC chip 8, which results in heating of the IC chip 8 by the heat from the hating jig. The temperature rise in the IC chip 8 affect the reliability of the IC chip.

3) Since the soldering process is performed in a state in which the module 2 is assembled to the card body 1 or incorporated into the sheet provided with antenna, portions to be soldered by the solder 13 are covered by the circuit substrate 7. Thus, the state of soldering cannot be checked by visual inspection.

4) If the amount of the solder 13 is in excess, the melted solder may spread to the lead wires 10 and the through holes 12 located in the vicinity of the antenna connection terminals 5, resulting in short circuiting the antenna connection terminals 5.

5) Since the area of the soldered portion is small, the strength of the soldered portion may not be sufficient.

SUMMARY OF THE INVENTION

It is a general object of the present invention to provide an improved and useful combination card in which the above-mentioned problems are eliminated.

A more specific object of the present invention is to provide a module of a combination card, which module can be incorporated into a card body with solder being easily melted and heat transmission to portions other than the antenna connection terminals being reduced.

In order to achieve the above-mentioned objects, there is provided according to one aspect of the present invention a combination card comprising: a card body provided with an antenna; and a module including a substrate which has a terminal surface on which at least one external connection terminal is formed and a mounting surface opposite to the terminal surface, an IC chip being mounted on the mounting surface, wherein said module includes at least one antenna connection terminal located on the mounting surface, the antenna connection terminal being connected to the antenna, and at least a part of the antenna connection terminal is exposed on the terminal surface.

According to the above-mentioned invention, when the module is assembled to the card body, the antenna connection terminal is connected to the antenna by a solder (or a silver paste). That is, the soldering is performed by melting the solder applied to the antenna connection terminal exposed on the mounting surface by pressing a heating jig against the antenna connection terminal exposed on the terminal surface. Accordingly, if the antenna connection terminal has a part exposed on the terminal surface, heat can be transmitted from the heating jig to the solder by passing through only the antenna connection terminal by pressing the heating jig against the exposed part of the antenna connection terminal. Thus, the solder is efficiently heated, and the temperature of the heating jig and the heating time van be reduced. Therefore, the card body and the IC chip mounted on the mounting surface can be prevented from being influenced by the heat from the heating jig.

In the combination card according to the present invention, the antenna connection terminal may be separated from the external connection terminal. In such a structure, the heating jig can be made in contact with only the antenna connection terminal formed on the mounting surface of the module. Since the antenna connection terminal is separated from the external connection terminal formed on the terminal surface, the heat supplied to the antenna connection terminal does not transmit to the external connection terminal via a metal part. Accordingly, the heat from the heating jig does not transmit to other parts such as the IC chip on the substrate via the external connection terminal.

Additionally, in the combination card according to the present invention, the antenna connection terminal may include a first antenna connection terminal formed on the terminal surface and a second antenna connection terminal formed on the mounting surface, and the first antenna connection terminal is electrically connected to the second antenna connection terminal via a through hole having a metal plated inner surface.

Accordingly, when the antenna connection terminal is heated by the heating jig, heat transmitted from the heating jig to the first antenna connection terminal reaches the second antenna connection terminal by transmitting the metal plated portion of the inner surface of the through hole. That is, the heat from the heating jig reaches the solder by transmitting a metal part. On the other hand, in the conventional module, the heat from the heating jig transmits from the antenna connection terminal to the solder via the substrate. Thus, according to the present invention, the heat from the heating jig transmits to the solder faster and more efficiently than the conventional module. Accordingly, the temperature of the heating jig can be set lower than that of the conventional module, and the heating time can be reduced. As a result, an amount of heat transmitted to portions other than the solder can be reduced, which prevents the card body from being deformed due to the heat. Additionally, since the amount of heat transmitted from the heating jig to the IC chip is reduced when the heating time is short, the temperature rise of the IC chip can also be reduced.

Additionally, a state of soldered portion can be checked by observing inside of the through hole after the soldering process is completed. Thus, a reliable soldering can be performed. Further, if the amount of solder is in excess, the excessive solder does not spread around the antenna connection terminal and is filled in the through hole. Accordingly, thee antenna connection terminal is prevented from short-circuiting due to the excessive solder. Additionally, even if an appropriate amount of the solder is: applied to the antenna connection terminal, some amount of the melted solder is filled in the through hole. Thereby, the soldered area is increased, and eth strength of soldered portion is increased.

Alternatively, in the combination card according to the present invention, the antenna connection terminal may be formed on the mounting surface, and at least one conductive bonding member may extend between the terminal surface and the mounting surface by passing through the substrate of the module so as to connect the antenna connection terminal to the antenna.

Additionally, there is provided according to another aspect of the present invention an IC card module configured and arranged to be used in a combination card, the IC card module comprising: a substrate having a terminal surface on which at least one external connection terminal is formed and a mounting surface opposite to the terminal surface; an IC chip mounted on the mounting surface; and at least one antenna connection terminal connected to an antenna provided in the combination card, at least a part of the antenna connection terminal being exposed on the terminal surface of the substrate.

Further, there is provided according to another aspect of the present invention a manufacturing method of a combination card provided with an IC card module incorporated into a flat member provided with an antenna, the manufacturing method comprising the steps of: applying an electrically conductive bonding material onto at least one antenna connection terminal provided in the IC card module; placing the IC card module in a predetermined position on the flat member; and bonding the antenna connection terminal to the antenna by the electrically conductive bonding material by heating said antenna connection terminal exposed on the terminal surface of said IC card module.

Other objects, features and advantages of the present invention will become more apparent from the following detailed description when read in conjunction with the accompanying drawings.

BRIEF DESCRIPTION OF THE DRAWINGS

FIG. 1,6 is an illustration for explaining a process of incorporating the module shown in FIG. 12 into a card body.

DETAILED DESCRIPTION OF THE PREFERRED EMBODIMENTS

Figure 7:
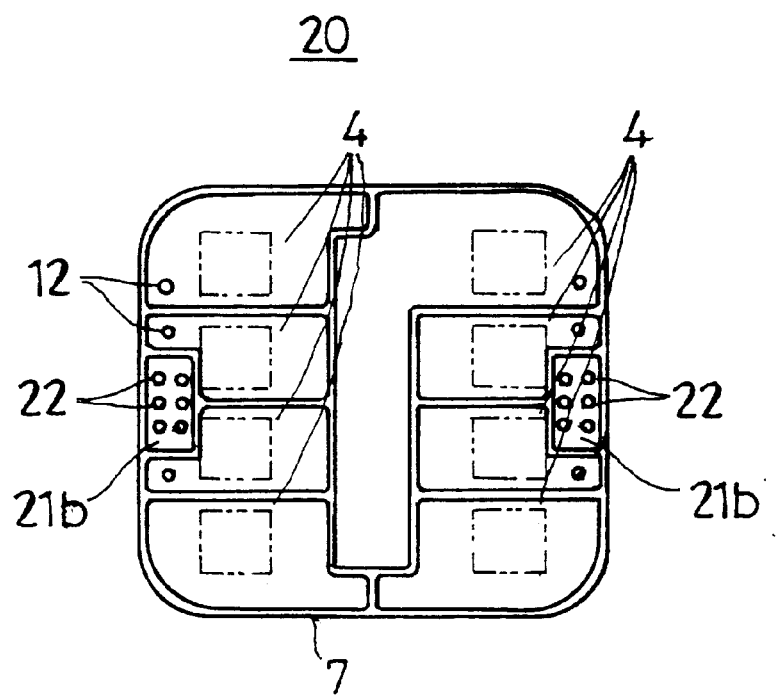
FIG. 7 is a plan view of a terminal surface of a module according to a first embodiment of the present invention.
Figure 8:
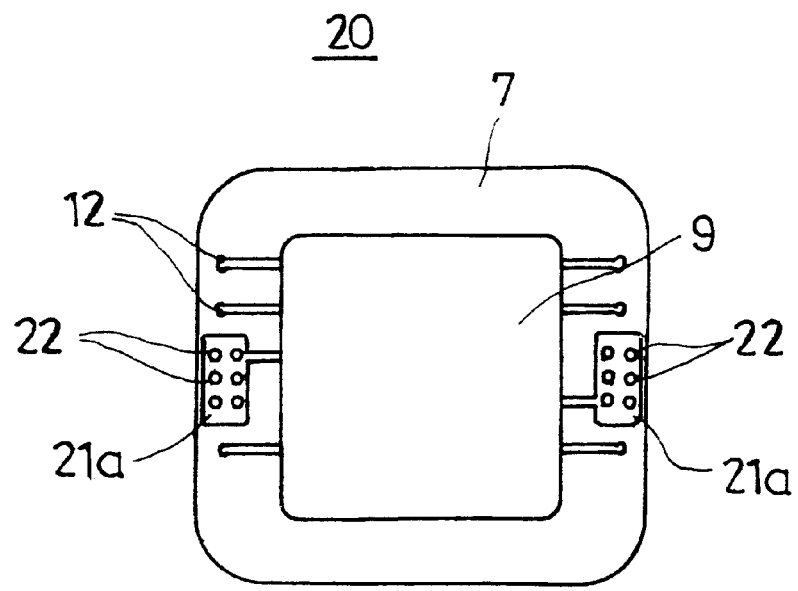
FIG. 8 is plan view of a mounting surface of the module shown in FIG. 7.

A description will now be given, with reference to FIGS. 7 to 11, of a first embodiment of the present invention. FIG. 7 is a plan view of a terminal surface of a module used in a combination card according to the first embodiment of the present invention. FIG. 8 is a plan view of a mounting surface of the module shown in FIG. 7. It should be noted that, in FIGS. 7 to 11, parts that are the same as the parts shown in FIGS. 1 to 5 are given the same reference numerals, and descriptions thereof will be omitted.

Figure 1:
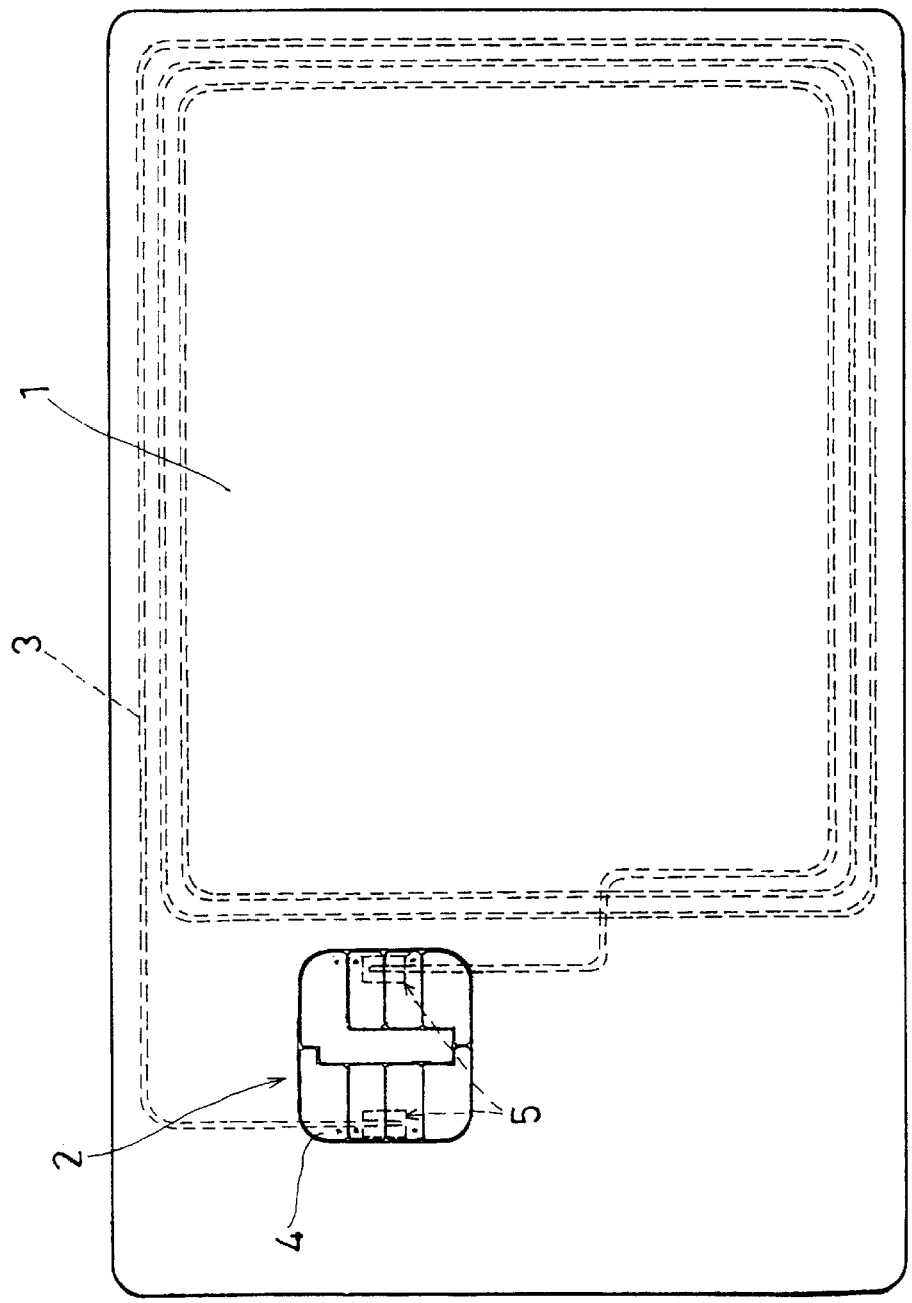
FIG. 1 is a plan view of a conventional combination card.
Figure 2:
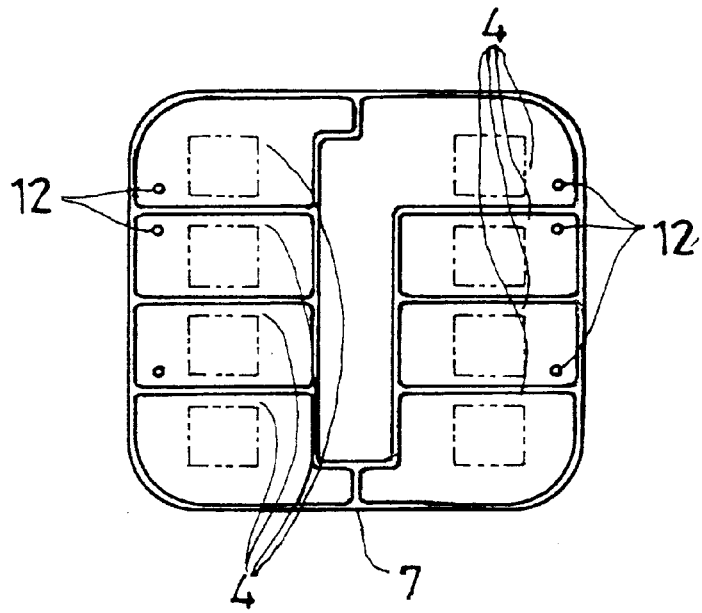
FIG. 2 is a plan view of a terminal surface of a module shown in FIG. 1.
Figure 3:
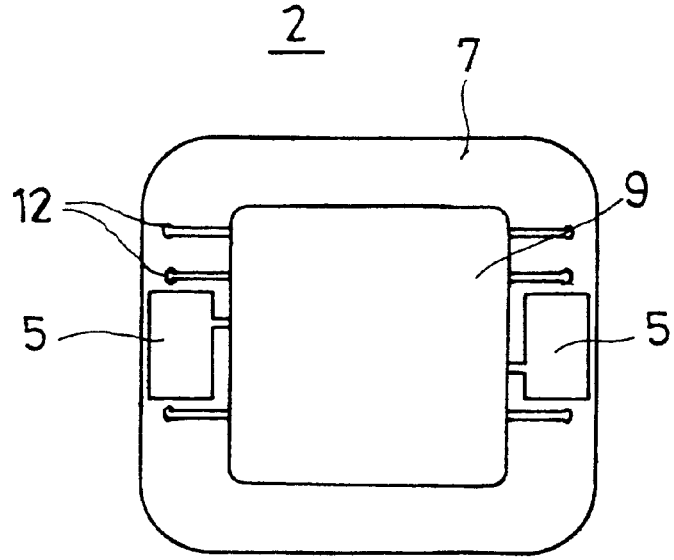
FIG. 3 is a plan view of a mounting surface of the module shown in FIG. 1.
Figure 4:
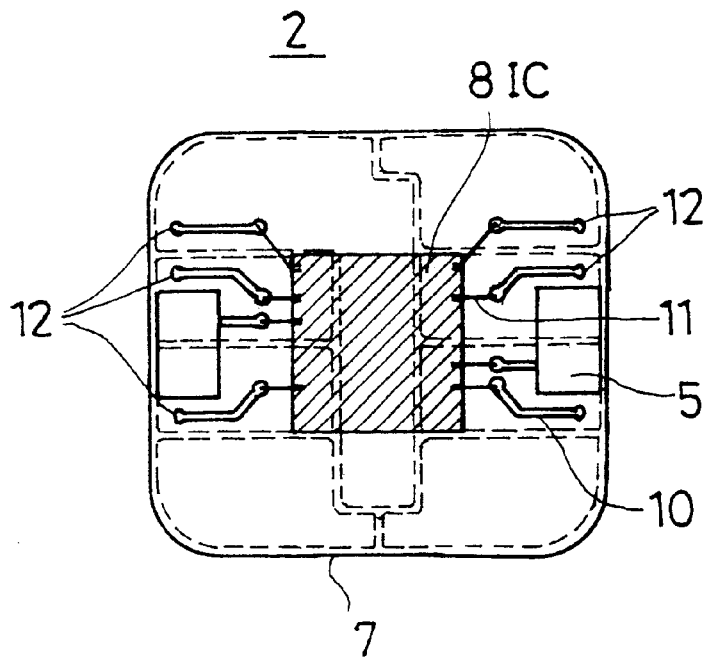
FIG. 4 is a plan view of the module before an IC chip is encapsulated by a seal resin.
Figure 5:
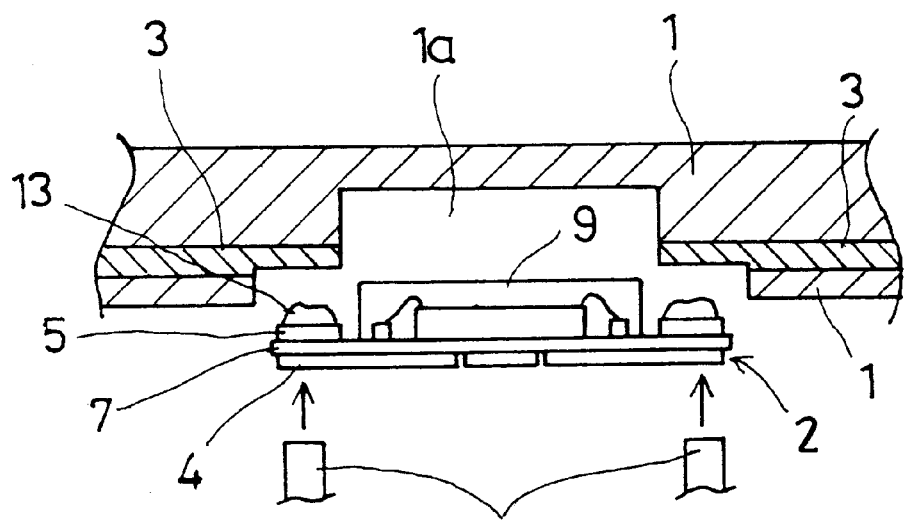
FIG. 5 is a side view of the module for explaining the process of incorporating the module into a card body.
Figure 6:
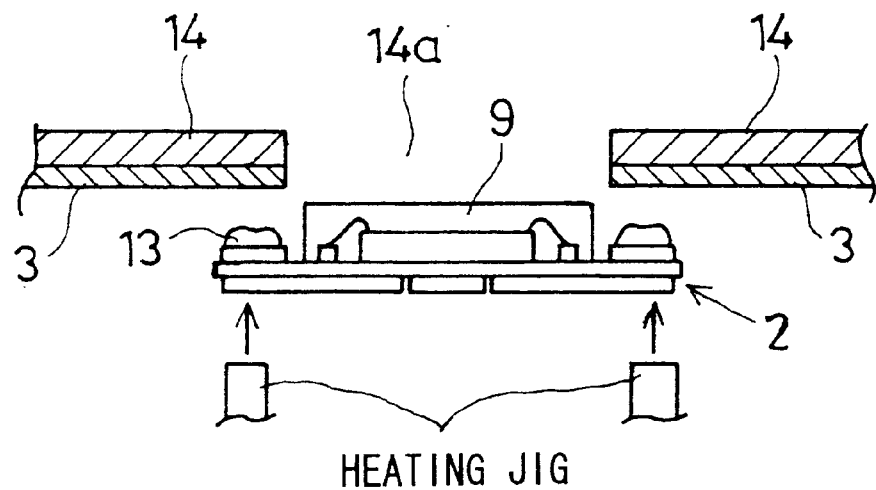
FIG. 6 is a side view of the module 2 for explaining the process of incorporating the module 2 into a sheet provided with antenna.
Figure 9:
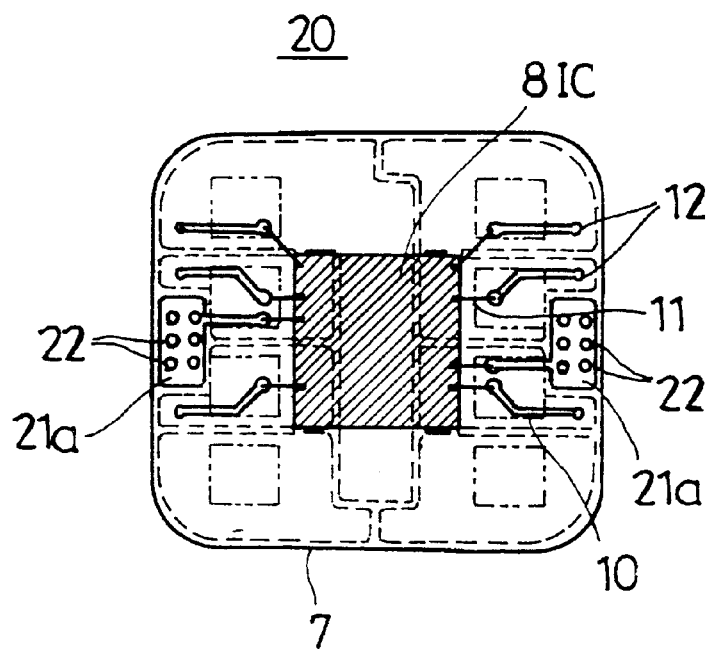
FIG. 9 is a plan view of an interior of a seal resin of the module shown in FIG. 7.

The combination card according to the first embodiment of the present invention comprises the card body 1 shown in FIG. 1 and a module 20 shown in FIGS. 7 to 9. That is, the module 20 is incorporated into the card body 1, and the terminal surface thereof is exposed on the surface of the card body 1.

The module 20 comprises the circuit substrate 7 and the IC chip mounted on the circuit substrate 7. As shown in FIG. 7, a plurality of flat external connection terminals (electrodes) 4 are formed on the terminal surface of the module 20. Unlike the conventional module 2, an antenna connection terminal 21b is formed in a portion corresponding to an antenna connection terminal 21a of the mounting surface. The antenna connection terminal 21b and the external connection terminals 4 are formed by patterning a copper plate applied to the circuit substrate 7 by etching. It should be noted that, an area indicated by a double dashed chain line in each of the external connection terminals 4 in FIG. 7 corresponds to an effective area of each of the external connection terminals 4.

As shown in FIG. 8, the IC chip 8 is mounted on the mounting surface of the module 20, and is encapsulated by the seal resin 9. As mentioned above, the antenna connection terminal 21a is formed on the mounting surface outside the seal resin 9.

FIG. 9 is a plan view of the module 20 before the IC chip 8 is encapsulated by the seal resin 9. The IC chip 8 is mounted in the center of the circuit substrate 7. The electrodes of the IC chip 8 are connected to the lead wires 10 formed on the mounting surface of the circuit substrate 7 by the bonding wires 11. The lead wires 10 are electrically connected to respective external connection terminals 4 on the terminal surface via respective through holes 12.

Figure 10:
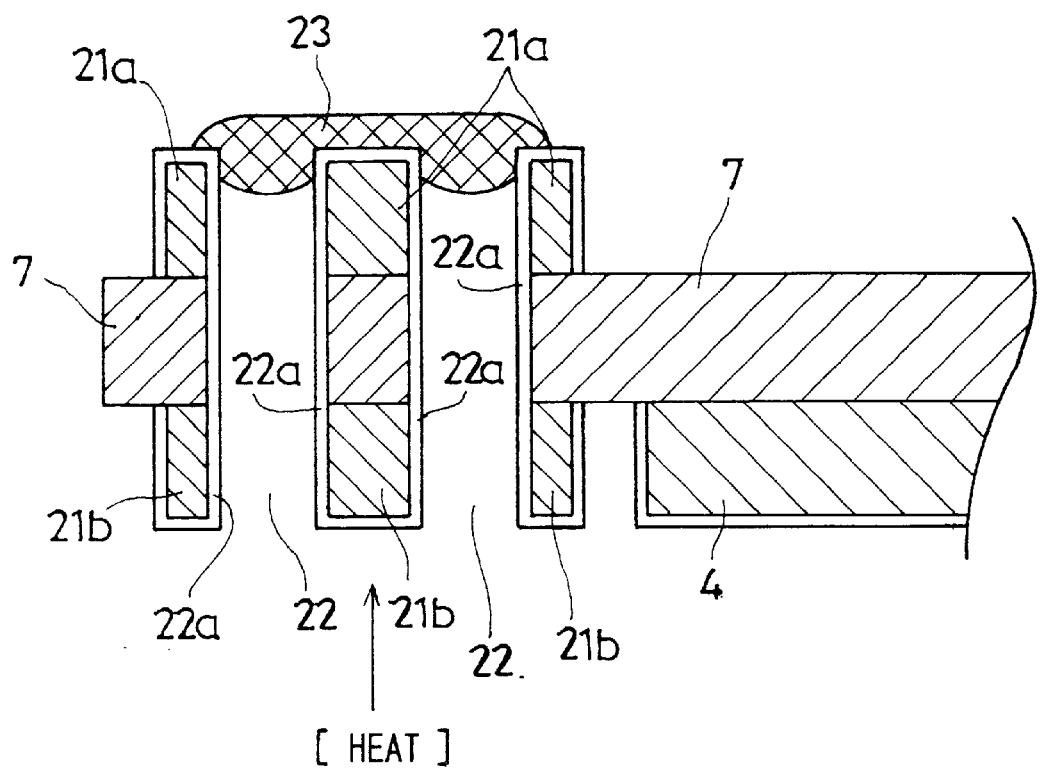
FIG. 10 is an enlarged cross-sectional view of a portion near antenna connection terminals of the module shown in FIG. 7.

FIG. 10 is an enlarged cross-sectional view of an area adjacent to the antenna connection terminals 21a and 21b of the module 20. As shown in FIG. 10, a plurality of through holes 22 are provided between each of the antenna connection terminals 21a formed on the mounting surface and the respective one of the antenna connection terminals 21b formed on the terminal surface.

An inner wall of each of the through holes 22 is metal (gold) plated similar to the conventional through hole such as the through hole 12 provided between the lead wires 10 and the external connection terminals 4. Accordingly, the through holes 22 can be formed in the same process as the through holes 12. However, in the present embodiment, the through holes 22 provided between the antenna connection terminals 21a and 21b is not used to provide an electrical connection but is used to transmit a heat. That is, the plating layer 22a on an inner wall of each of the through holes 22 facilitates the heat transmission from the antenna connection terminals 21b to the antenna connection terminals 21a.

In the present embodiment, six through holes 22 are provided to one antenna connection terminal 21a over the entire surface of the antenna connection terminal 21a.

Figure 11:
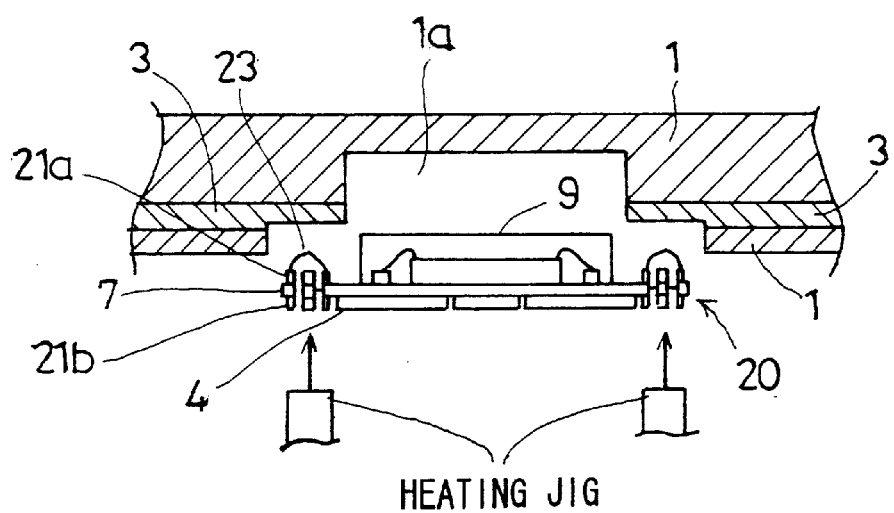
FIG. 11 is an illustration for explaining a process of incorporating the module shown in FIG. 7 into a card body.

A description will now be given, with reference to FIG. 11, of a process of incorporating the module 20 into the card body 1. The card body 1 is previously provided with antenna 3. The recess 1a is formed in a predetermined portion of the card body 1. Opposite ends of the antenna 3 are exposed in the vicinity of the recess 1a so that the antenna connection terminal 21a of the module 20 is soldered thereto.

When the module 20 is incorporated into the card body 1, paste-like solder 23 is applied onto each of the antenna connection terminals 21a on the mounting surface of the module 20. Then, the module 20 is assembled to the card body 1 so that the seal resin 9 fits in the recess 1a of the card body 1. At this time, the solder 23 on each of the antenna connection terminals 21a contacts the respective opposite end of the antenna 3. In this state, a heating jig (solder iron) is pressed against the antenna connection terminals 21b formed on the terminal surface of the module 20 so as to melt the solder 23 by the heat from the heating jig to connect the antenna connection terminals 21a to the respective ends of the antenna 3. It should be noted that a conductive bonding material such as a silver paste may be used instead of paste solder 23.

When the antenna connection terminal 21b is heated, the heat transmitted from the heating jig to the antenna connection terminal 21b reaches the antenna connection terminal 21a on the opposite side by transmitting through the plating part on an inner surface of the through holes 22. That is, the heat form the heating jig is transmitted to the solder 23 via a metal portion. On the other hand, in the conventional module 2, the heat form the hating jig is transmitted from the antenna connection terminal 5 to the solder. Accordingly, in the module 20 according to the present embodiment, the heat from the heating jig is transmitted to the solder 23 more quickly and efficiently than the conventional module 2. Thus, the temperature of the heating jig can be set lower than the conventional one, and the heating time can be reduced. As a result, a heat transmitted to parts other than the solder 23 can be reduced, and the card body 1 is prevented from being deformed. Additionally, the short heating time reduces an amount of heat transmitted from the heating jig to the IC chip 8, a temperature rise of the IC chip 8 can be reduces.

Additionally, in the present embodiment, the heating jig contacts only the antenna connection terminals 21b formed on the terminal surface of the module 20. The antenna connection terminals 21b are separated from the external connection terminals 4, and the heat supplied to the antenna connection terminals 21b does not directly transmit to the external connection terminals 4. That is, the heat supplied to the antenna connection terminals 21b does not transmit to the antenna connection terminals 21b via a metal portion. Accordingly, the heat of the heating jig cannot transmit to the IC chip 8 through a metal part such as the external connection terminal 4. Thus, a bad influence due to the temperature rise in the IC chip 8 during the soldering process can be reduced.

In the present embodiment, a plurality of thorough holes 22 are provided to each of the antenna connection terminals 21b, and, thus, the state of the soldered portion can be checked by visually inspecting inside the through holes 22. Accordingly, a reliable soldering can be achieved. In the present embodiment, although a plurality of through holes 22 are provided, a single though hole may provide a similar effect.

Further, in the present embodiment, if the amount of the solder 23 is in excess, the excessive solder does not spread around the antenna connection terminals 21a, and is filled in the though holes 22. Accordingly, the terminals are prevented from short-circuiting to each other.

On the other hand, when the amount of the solder 23 is appropriate, some amount of the melted solder is filled in the through holes 22. Thereby, an area of the soldered portion is increased, and the strength of the soldering is increase.

Figure 12:
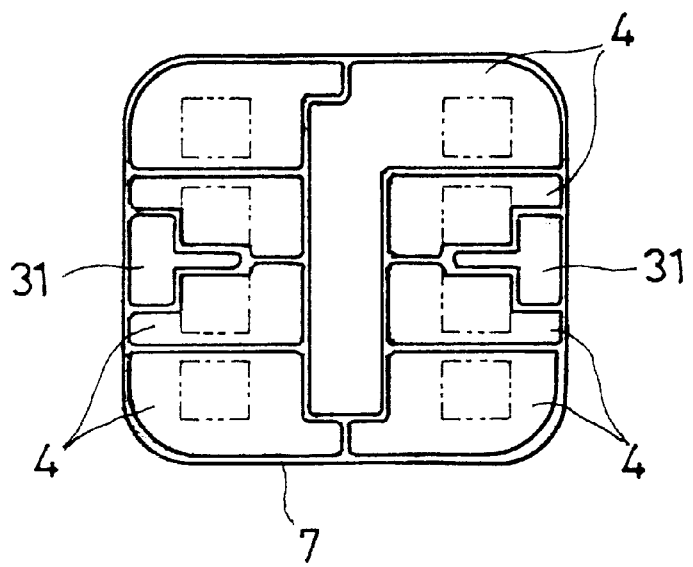
FIG. 12 is a plan view of a terminal surface of a module according to a second embodiment of the present invention.
Figure 13:
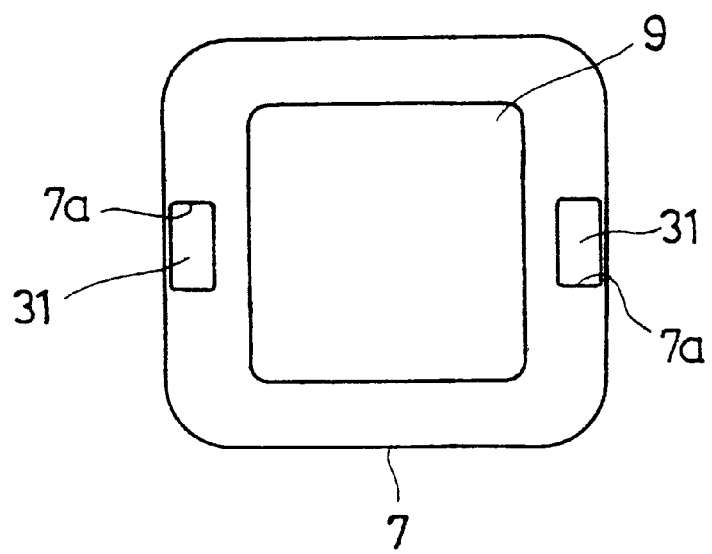
FIG. 13 is plan view of a mounting surface of the module shown in FIG. 12.

A description will now be given, with reference to FIGS. 12 through 16, of a second embodiment of the present invention. FIG. 12 is a plan view of a terminal surface of a module used in a combination card according to the second embodiment of the present invention. FIG. 13 is a plan view of the module shown in FIG. 12. It should be noted that in FIGS. 12 through 16, parts that are the same as the parts shown in FIGS. 1 through 5 are given the same reference numerals.

The combination card according to the second embodiment of the present invention comprises the card body 1 shown in FIG. 1 and the module 30 shown in FIGS. 12 through 16. That is, the module 30 is incorporated into the card body 1, the terminal surface of the module 30 is exposed on the surface of the card body 1.

The module 30 comprises the circuit substrate 7 and the IC chip 8 (refer to FIG. 14) mounted on the circuit substrate 7. As shown in FIG. 12, a plurality of flat external connection terminals (electrodes) 4 are formed on the terminal surface of the module 30. Additionally, unlike the conventional module 2, antenna connection terminals 31 are formed on the terminal surface of the module 30. The antenna connection terminals 31 and the external connection terminals 4 are formed by patterning a copper plate applied to the circuit substrate 7 by etching. Portions of the circuit substrate 7 corresponding to the antenna connection terminals 31 are provided with openings 7a as shown in FIG. 13. The antenna connection terminals 31 are exposed on the mounting surface. It should be noted that in FIG. 2, an area indicated by a double dashed chain line corresponds to an effective area of each of the external connection terminals 4.

As shown in FIG. 13, the IC chip 8 is mounted on the mounting surface of the module 30, and is encapsulated by a real resin 9. No circuit pattern is formed on the mounting surface of the module 30. That is, the electrodes of the IC chip 8 are directly connected to the external connection terminals 4 and the antenna connection terminals 31.

Figure 14:
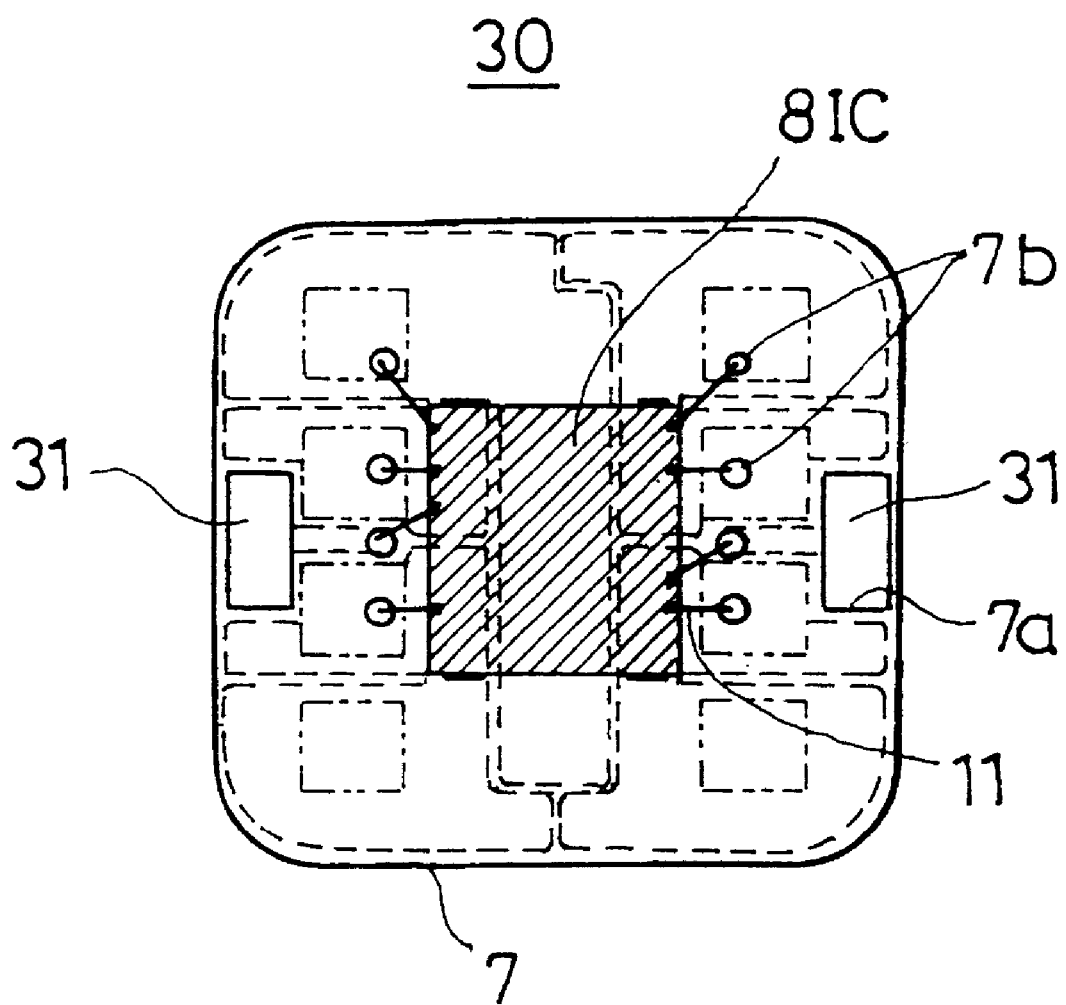
FIG. 14 is a plan view of an interior of a seal resin of the module shown in FIG. 12.

FIG. 14 is a plan view of the module 30 before the IC chip 8 is encapsulated by the seal resin 9. The IC chip 8 is mounted in the center of the circuit substrate 7, and an opening 7b is formed at a position corresponding to each of the external connection terminals 4 and the antenna connection terminals 31. The electrodes of the IC chip 8 are electrically connected to the respective external connection terminals 4 and the antenna connection terminals 31 via bonding wires. The seal resin 9 is provided so as to encapsulate the IC chip 8 and the openings 7b.

Figure 15:
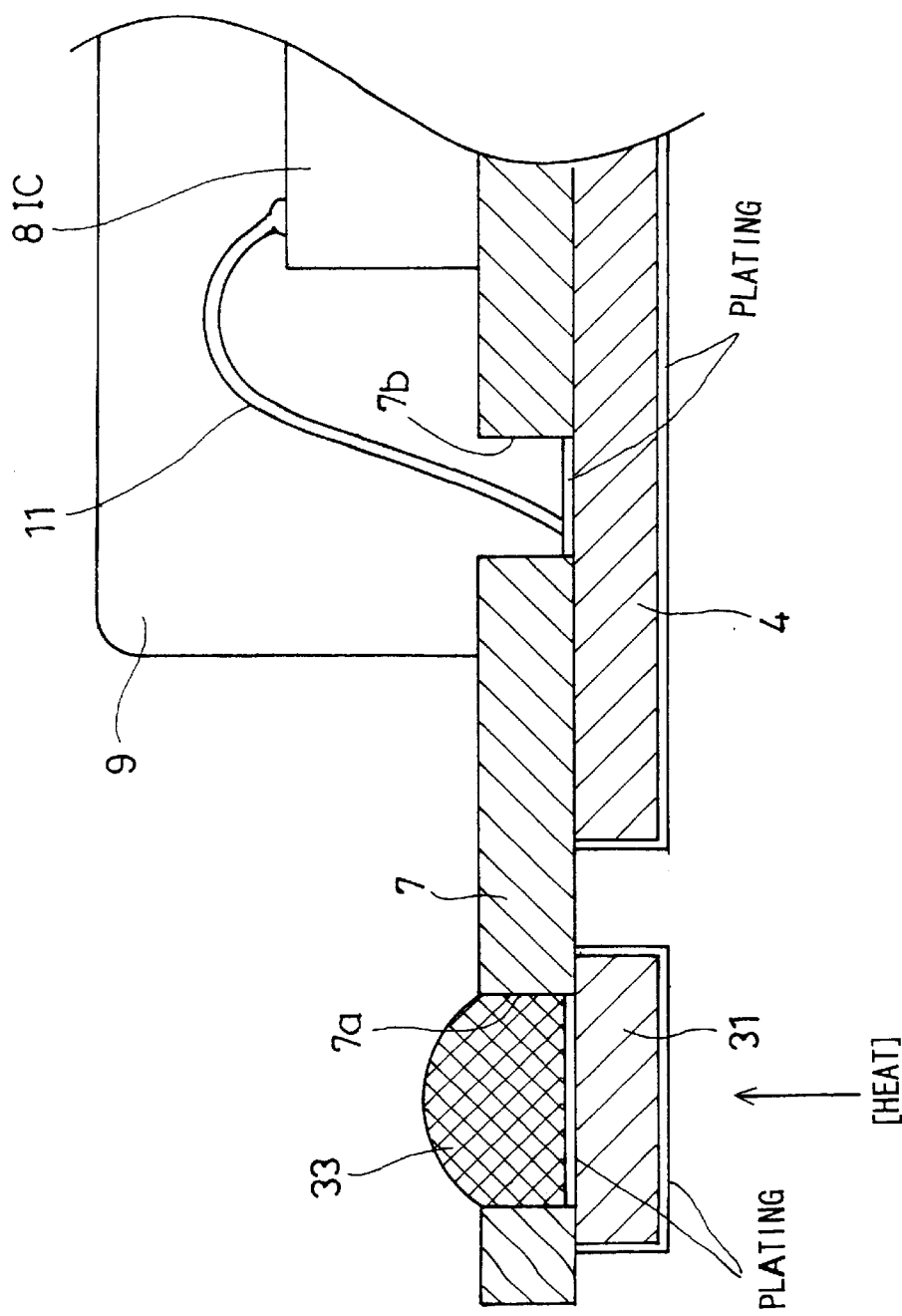
FIG. 15 is an enlarged cross-sectional view of a portion near antenna connection terminals of the module shown in FIG. 12.

FIG. 15 is an enlarged cross-sectional view of a portion including the antenna connection terminal 31 and the opening 7b of the module 30. As shown in FIG. 15, in the present embodiment, the module 30 is constituted by a single-side copper applied substrate. That is, a copper plate is applied to one side of the circuit substrate 7 so that the external connection terminals 4 and the antenna connection terminals 31 are formed by etching the copper plate. The external connection terminals 4 and the antenna connection terminals 31 are exposed on the side of the mounting surface through the openings 7a and 7b. Thereby, a solder 33 can be supplied from the side of the mounting surface to the antenna connection terminals 31. Additionally, the bonding wires 11 can be connected to the external connection terminals 4 and the antenna connection terminals 31 from the side of the mounting surface.

A description will now be given, with reference to FIG. 16, of a process of incorporating the module 30 into the card body 1. The antenna 3 is previously embedded in the card body 1. Additionally, the recess 1a, which receives the seal resin 9, is provided in a predetermined portion of card body 11. The opposite ends of the antenna 3 expose in the vicinity of the recess 1a. The antenna terminals 31 of the module 30 are connected to the opposite ends of the antenna 3, respectively, by a conductive bonding material such as a solder or a silver paste. In the present embodiment, a solder is used.

In order to incorporate the module 30 into the card body 1, the paste solder 33 is applied to the antenna connection terminals 31 of the module 30 from the side of the mounting surface through the openings 7a. The module 30 is incorporated into the card body 1 so that the seal resin 9 fits in the recess 1a of the card body 1. At this time, the solder 33 on each of the antenna connection terminals 31 contacts the respective one of the ends of the antenna 3. In this state, the heating jig (solder iron) is pressed against the antenna connection terminals 31 formed on the terminal surface of the module 30 so as to melt the solder 33 by the heat from the heating jig and solder the antenna connection terminals 31 and the ends of the antenna 3.

Figure 17:
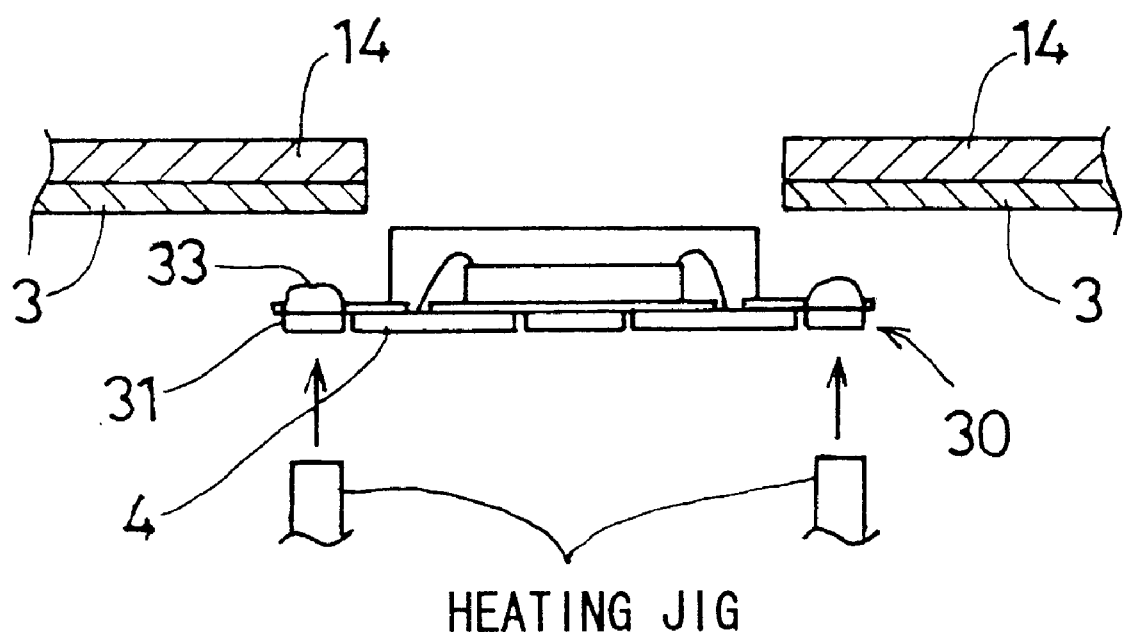
FIG. 17 is an illustration for explaining a process of incorporating the module shown in FIG. 12 into a sheet provided with an antenna.

FIG. 17 is an illustration for explaining a process of incorporating the module 30 into the sheet 14 provided with antenna. The antenna 3 is previously provided in the sheet 14. Additionally, an opening, which receives the seal resin 9, is provided in a predetermined position of the sheet 14. The antenna connection terminals 31 of the module 30 are bonded by a conductive bonding material such as a solder or a silver paste. In the present embodiment, a solder is used.

In order to incorporate the module 30 into the sheet 14, a paste solder 33 is applied to the antenna connection terminals 31 of the module 30 from the side of the mounting surface through the openings 7a. The module 30 is incorporated into the card body 1 so that the seal resin 9 fits in the recess 14a of the sheet 14. At this time, the solder 33 on each of the antenna connection terminals 31 contacts the respective one of the ends of the antenna 3. In this state, the heating jig (solder iron) is pressed against the antenna connection terminals 31 formed on the terminal surface of the module 30 so as to melt the solder 33 by the heat from the heating jig and solder the antenna connection terminals 31 and the ends of the antenna 3.

Figure 16:
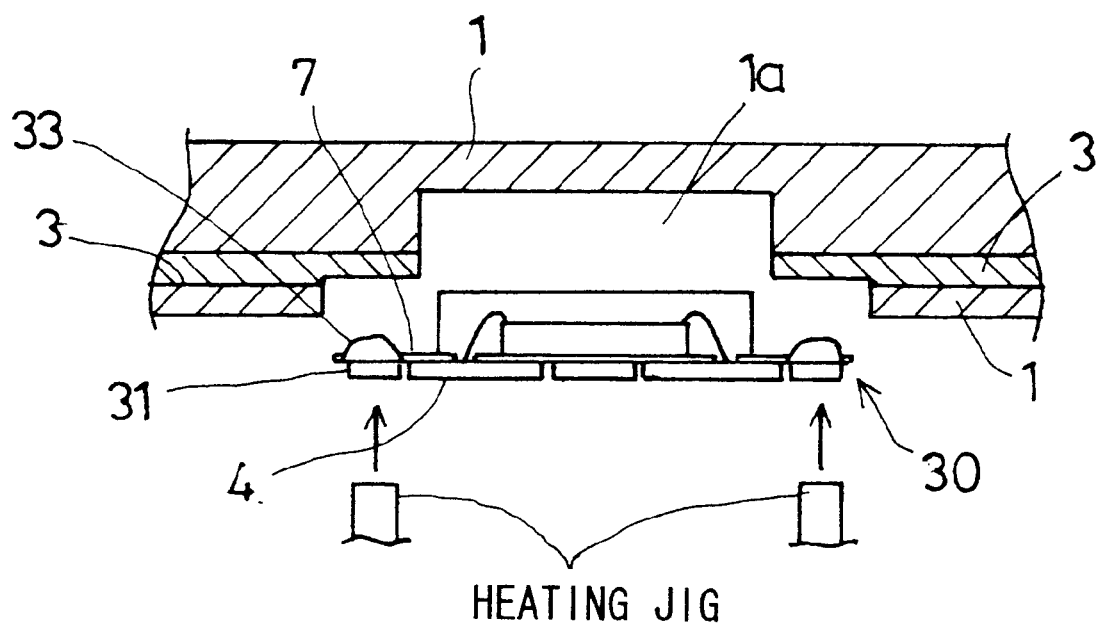

In either case shown in FIG. 16 or 17, a heat supplied by the heating jig to the antenna connection terminals 31 directly transmits to the solder 33. On the other hand, in the conventional module 2, a heat supplied by the heating jig reaches the solder by transmitting through the circuit substrate 7 and the antenna connection terminals 5. Accordingly, in the module 30 according to the present embodiment, the heat from the heating jig can be more rapidly and efficiently transmitted to the solder 33 than the conventional module 2. Thus, the temperature of the heating jig can be set lower than the conventional one. As a result, a heat transmitting to portions other than the solder 33 can be reduced, which prevent the card body 1 or the sheet 14 from deforming due to the heat. Additionally, when the heating time is reduced, an amount of heat transmitted from the heating jig to the IC chip 8 is reduced. Thereby, a temperature rise of the IC chip 8 can be reduced.

In the present embodiment, the heating jig contacts only the antenna connection terminals 31 formed on the terminal surface of the module 30. The antenna connection terminals 31 are separated from the external connection terminals 4 formed on the terminal surface. Thus, the heat supplied to the antenna connection terminals 31 do not directly transmit to the external connection terminals 4, that is, the heat does not transmits to the external connection terminals 4 through a metal portion. Accordingly, the heat does not transmit to the IC chip 8 through the external connection terminals 4 as is in the conventional module 2. Thus, when the soldering operation is performed, an undesirable influence to the IC chip 8 due to a temperature rise can be further reduced.

Additionally, according to the present embodiment, since the module 30 is produced by a substrate with a copper plate on a single side, the module 30 can be produced at a lower cost than the conventional module 2.

The present invention is not limited to the specifically disclosed embodiments, and variations and modifications may be made without departing from the scope of the present invention.

The present application is based on Japanese priority application No. 11-289936 filed on Oct. 12, 1999, the entire contents of which are hereby incorporated by reference.

What is claimed is:

1. A combination card comprising:
   a card body provided with an antenna; and
   a module including a substrate which has a terminal surface on which at least one external connection terminal is formed and a mounting surface opposite to the terminal surface, an IC chip being mounted on the mounting surface,
   wherein said module includes at least one antenna connection terminal located on the mounting surface, the antenna connection terminal being connected to said antenna, and at least a part of said antenna connection terminal is exposed on said terminal surface.

2. The combination card as claimed in claim 1, wherein said antenna connection terminal is separated from said external connection terminal.

3. The combination card as claimed in claim 1, wherein said antenna connection terminal includes a first antenna connection terminal formed on said terminal surface and a second antenna connection terminal formed on said mounting surface, and said first antenna connection terminal is electrically connected to said second antenna connection terminal via a through hole having a metal plated inner surface.

4. The combination card as claimed in claim 2, wherein said antenna connection terminal includes a first antenna connection terminal formed on said terminal surface and a second antenna connection terminal formed on said mounting surface, and said first antenna connection terminal is electrically connected to said second antenna connection terminal via a through hole having a metal plated inner surface.

5. The combination card as claimed in claim 1, wherein said antenna connection terminal is formed on said mounting surface, and at least one conductive bonding member extends between said terminal surface and said mounting surface by passing through said substrate of said module so as to connect said antenna connection terminal to said antenna.

6. The combination card as claimed in claim 2, wherein said antenna connection terminal is formed on said mounting surface, and at least one conductive bonding member extends between said terminal surface and said mounting surface by passing through said substrate of said module so as to connect said antenna connection terminal to said antenna.

7. An IC card module configured and arranged to be used in a combination card, the IC card module comprising:

a substrate having a terminal surface on which at least one external connection terminal is formed and mounting surface opposite to the terminal surface;

an IC chip mounted on said mounting surface; and at least one antenna connection terminal connected to an antenna provided in said combination card, at least a part of said antenna connection terminal disposed on said mounting surface being exposed on said terminal surface of said substrate.

8. A manufacturing method of a combination card provided with an IC card module incorporated into a flat member provided with an antenna, the manufacturing method comprising the steps of:

applying an electrically conductive bonding material onto at least one antenna connection terminal provided in said IC card module;

placing said IC card module in a predetermined position on said flat member; and bonding said antenna connection terminal to said antenna by an electrically conductive bonding material by heating said antenna connection terminal exposed on said terminal surface of said IC card module.

9. A combination card comprising:

a card body provided with an antenna; and a module including a substrate which has a terminal surface on which at least one external connection terminal is formed and a mounting surface opposite to the terminal surface, an IC chip being mounted on the mounting surface, wherein said module includes at least one antenna connection terminal located on the terminal surface, the antenna connection terminal being connected to said antenna, and at least a part of said antenna connection terminal is exposed on said mounting surface.

10. The combination card as claimed in claim 9, wherein said antenna connection terminal is separated from said external connection terminal.

11. The combination card as claimed in claim 9, wherein said antenna connection terminal includes a first antenna connection terminal formed on said terminal surface and a second antenna connection terminal formed on said mounting surface, and said first antenna connection terminal is electrically connected to said second antenna connection terminal via a through hole having a metal plated inner surface.

12. The combination card as claimed in claim 10, wherein said antenna connection terminal includes a first antenna connection terminal formed on said terminal surface and a second antenna connection terminal formed on said mounting surface, and said first antenna connection terminal is electrically connected to said second antenna connection terminal via a through hole having a metal plated inner surface.

13. The combination card as claimed in claim 9, wherein said antenna connection terminal is formed on said terminal surface, and at least one conductive bonding member extends etween said terminal surface and said mounting surface by passing through said substrate of said module so as to connect said antenna connection terminal to said antenna.

14. The combination card as claimed in claim 10, wherein said antenna connection terminal is formed on said terminal surface, and at least one conductive bonding member extends between said terminal surface and said mounting surface by passing through said substrate of said module so as to connect said antenna connection terminal to said antenna.

15. An IC card module configured and arranged to be used in a combination card, the IC card module comprising:

a substrate having a terminal surface on which at least one external connection terminal is formed and a mounting surface opposite to the terminal surface;

an IC chip mounted on said mounting surface; and at least one antenna connection terminal connected to an antenna provided in said combination card, at least a part of said antenna connection terminal disposed on said terminal surface being exposed on said mounting surface of said substrate.

16. a manufacturing method of a combination card provided with an IC card module incorporated into a flat member provided with an antenna, the manufacturing method comprising the steps of:

applying an electrically conductive bonding material onto at least one antenna connection terminal provided in said IC card module;

placing said IC card module in a predetermined position on said flat member; and bonding said antenna connection terminal to said: antenna by an electrically conductive bonding material by heating said antenna connection terminal disposed on a terminal surface of said IC card module and exposed on a mounting surface of said IC card module.

* * * * *

UNITED STATES PATENT AND TRADEMARK OFFICE
CERTIFICATE OF CORRECTION

PATENT NO.    : 6,460,773 B1
DATED         : October 8, 2002
INVENTOR(S)   : Hiroshi Kaiya et al.

It is certified that error appears in the above-identified patent and that said Letters Patent is hereby corrected as shown below:

<u>Title page,</u>
Item [30], Foreign Application Priority Data, should read as follows:
-- Oct. 12, 1999 --.

Signed and Sealed this

Twenty-fifth Day of March, 2003

JAMES E. ROGAN
*Director of the United States Patent and Trademark Office*